(12) United States Patent
Williams et al.

(10) Patent No.: US 6,738,919 B2
(45) Date of Patent: May 18, 2004

(54) SIGNAL TRACE PHASE DELAY

(75) Inventors: Steven L. Williams, Round Rock, TX (US); Richard N. Worley, Cedar Park, TX (US); Satish N. Pratapneni, Milpitas, CA (US); Leroy Jones, Jr., Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 533 days.

(21) Appl. No.: 09/771,094

(22) Filed: Jan. 26, 2001

(65) Prior Publication Data

US 2002/0104034 A1 Aug. 1, 2002

(51) Int. Cl.[7] .............................................. G06F 1/12
(52) U.S. Cl. ........................ 713/401; 361/818; 333/12
(58) Field of Search ................... 713/400, 401, 713/500, 501, 503, 600; 361/792, 793, 794, 816, 818; 333/12, 32, 35

(56) References Cited

U.S. PATENT DOCUMENTS

| | | | | | |
|---|---|---|---|---|---|
| 5,157,308 | A | * | 10/1992 | Rindal | 315/85 |
| 6,191,475 | B1 | * | 2/2001 | Skinner et al. | 257/700 |
| 6,202,167 | B1 | * | 3/2001 | Lai et al. | 713/501 |
| 6,487,673 | B1 | * | 11/2002 | Nonomura | 713/401 |
| 6,510,058 | B1 | * | 1/2003 | Kozakiewicz | 361/760 |
| 6,643,317 | B1 | * | 11/2003 | Blumer | 375/130 |

* cited by examiner

*Primary Examiner*—Thomas Lee
*Assistant Examiner*—Thuan Du
(74) *Attorney, Agent, or Firm*—Baker Botts L.L.P.

(57) ABSTRACT

A technique for reducing electromagnetic interference (EMI) in electronic systems that provides a phase shift between signals having a common frequency component propagating on adjacent portions of circuit board signal traces. The phase shift is produced by a delay element in one of the adjacent signal traces. In one example, the delay element includes a serpentine delay located at the signal generating circuit side of the adjacent portion of the signal trace. Such a technique can be used to reduce EMI emissions from clock signals provided to RAM circuits of a system memory of a computer system.

24 Claims, 2 Drawing Sheets

SIGNAL TRACE PHASE DELAY

BACKGROUND OF THE INVENTION

1. Field of the Invention

This invention relates in general to electronic systems and in particular to the reduction of EMI emissions in electronic systems.

2. Description of the Related Art

Computer systems are information handling electronic systems that can be designed to give independent computing power to one user or a plurality of users. Computer systems may be found in many forms including, for example, mainframes, minicomputers, workstations, servers, personal computers, internet terminals, notebooks, and embedded systems. Computer systems include desk top, floor standing, rack mounted, or portable versions. A typical computer system includes at least one system processor, associated memory and control logic, and peripheral devices that provide input and output for the system. Such peripheral devices may include display monitors, keyboards, mouse-type input devices, floppy and hard disk drives, CD-ROM drives, printers, network capability card circuits, terminal devices, modems, televisions, sound devices, voice recognition devices, electronic pen devices, and mass storage devices such as tape drives, CD-R drives, or DVDs.

Electronic systems inherently generate electromagnetic (EM) fields. All EM fields are originally sourced by active electronic components in the system, but are delivered into space as Electromagnetic Interference (EMI) by various system structures which act as antennas. One source of EMI is from differential and common mode EM fields from traces and planes of circuit boards.

The Federal Communications Commission (FCC) in the United States and other international agencies set standards for the maximum intensity of electromagnetic energy which can be radiated and conducted in specific electromagnetic bands from a computer system. Shielding can be used to reduce EMI emissions from a computer system. However the greater the intensity of EM fields generated by the system, the higher the required shielding efficiency (SE) of the shield if needed to reduce EM emissions. Increasing the SE typically is accomplished by increasing the thickness of the metal panels of a metal shield or increasing the thickness of metallic coating on the outer plastics of the computer system, either of which increases the cost, complexity, and/or weight of the system. Furthermore, designing a shield with a high SE requires that interface structures be built within high tolerances to prevent EM waves from leaking through the shield via openings in the shield, such as openings for receiving external data and power signals. These high tolerance interface structures also add to the cost and/or complexity of a computer system.

Because of these and other disadvantages, it is desirable to reduce the EM radiation generated by the signal traces of an electronic system. Examples of techniques for reducing EM radiation include capacitive filtering of clock leads, proper termination and routing techniques of signal traces, and preventing, where possible, the signal traces from crossing splits in the reference planes. Examples of techniques for reducing EM radiation are found in U.S. Pat. No. 6,150,895 entitled "Circuit Board Voltage Plane Impedance Matching," having listed inventors Todd Steigerwald and Mitchell Sebring, and a common assignee, and in U.S. Patent Application entitled "Improving the EMC Characteristics of a Printed Circuit Board," having listed inventor Jeffrey C. Hailey, a common assignee, and a serial number of 09/400,025, now U.S. Pat. No. 6,349,038, both of which are hereby incorporated by reference in their entirety.

What is needed are additional techniques for reducing EMI radiation.

SUMMARY OF THE INVENTION

It has been discovered that providing a phase shift between signals having a common frequency component transmitted on adjacent portions of circuit board signal traces advantageously reduces EMI emissions from those signals.

In one aspect of the invention, a circuit board includes a first signal trace for coupling to a first circuit to provide a first signal to the first circuit. The circuit board includes a second signal trace for coupling to a second circuit to provide a second signal to the second circuit. The first signal and the second signal have a common frequency component. The first signal trace and the second signal trace each include adjacent portions being located adjacent to each other on a signal layer of the circuit board. The first signal trace includes a first delay element located generally towards a first side of its adjacent portion opposite a first circuit side of its adjacent portion to provide a phase shift between the first signal transmitted on the adjacent portion of the first signal trace and the second signal transmitted on the adjacent portion of the second signal trace to reduce electromagnetic interference emissions due to signals propagating on the adjacent portions of the signal traces.

In another aspect of the invention, a computer system includes a processor, a memory operably coupled to the processor, and a circuit board. The circuit board includes a first signal trace coupled to a first circuit to provide a first signal to the first circuit and a second signal trace coupled to a second circuit to provide the second signal to the second circuit. The first signal and the second signal have a common frequency component. The first signal trace and the second signal trace each include adjacent portions being located adjacent to each other on a signal layer of the circuit board. The first signal trace includes a first delay element located generally towards a first side of its adjacent portion opposite a first circuit side of its adjacent portion to provide a phase shift between the first signal transmitted on the adjacent portion of the first signal trace and the second signal transmitted on the adjacent portion of the second signal trace to reduce electromagnetic interference emissions due to signals propagating on the adjacent portions of the signal traces.

In another aspect of the invention, a circuit board includes a first signal trace for coupling to a first circuit to provide a first signal to the first circuit and a second signal trace for coupling to a second circuit to provide a second signal to the second circuit. The first signal and the second signal have a common frequency component. The first signal trace and the second signal trace each include adjacent portions being located adjacent to each other on a signal layer of the circuit board. The circuit board also includes means for providing a phase shift between the first signal transmitted on the adjacent portion of the first signal trace and the second signal transmitted on the adjacent portion of the second signal trace to reduce electromagnetic interference emissions due to the signals propagating on the adjacent portions of the signal traces.

In another aspect of the invention, a method for making a circuit board includes providing a first signal trace with an adjacent portion and a first delay located generally towards a first side of the adjacent portion. The first signal trace is positioned to carry a first signal to a first circuit. The method also includes providing a second signal trace with an adjacent portion and a second delay located generally towards a second side of the adjacent portion. The adjacent portion of the second signal trace is adjacent to the adjacent portion of the first signal trace. The second signal trace is positioned to carry a second signal to a second circuit. The first signal and the second signal have a common frequency component. The first and second delays are sized to provide a phase shift between the first signal transmitted on the adjacent portion of the first signal trace and the second signal transmitted on the adjacent portion of the second signal trace to reduce electromagnetic interference emissions due to the signals propagating on the adjacent portions of the signal traces and to provide the first signal to the first circuit generally in sync with the second signal being provided to the second circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
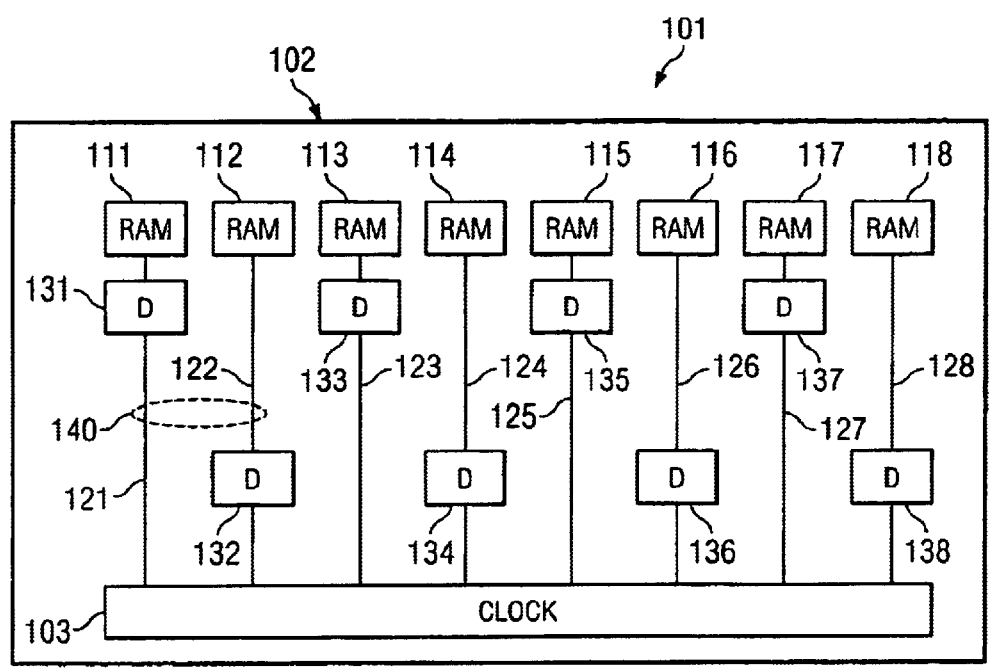
FIG. 1 is a bottom view of an example of a circuit board according to the present invention.

FIG. 1 shows a bottom view of a circuit board that can be used in a computer system or other electronic system. Mounted to the bottom planar side 102 of circuit board 101 is a clock circuit 103 and eight RAM chips 111–118, which in one embodiment, are e.g., synchronous dynamic random access memory (SDRAM) chips. In one embodiment, RAM chips 111–118 are part of a system memory (e.g. 405 of FIG. 4) for a computer system. Each RAM Chip 111–118 is coupled to clock circuit 103 via a signal trace of signal traces 121–128, respectively, to receive a clock signal from clock circuit 103. Signal traces 121–128 include trace portions etched on the bottom signal layer.

Each signal trace of signal traces 121–128 includes a portion that is adjacent to at least one other signal trace of signal traces 121–128. For example, signal traces 121 and 122 each include portions 140 that are adjacent to each other.

Each signal trace of signal traces 121–128 includes a delay element located generally towards one side of the adjacent portion. For example, delay element 131 is located towards the RAM circuit side of adjacent portions 140 and delay element 132 is located towards the clock circuit side of adjacent portions 140. Delay element 132 is sized to provide delay in the clock signal transmitted over signal trace 122 so as to provide a phase shift between the clock signal propagating on the adjacent portion 140 of trace signal 122 and the clock signal propagating on the adjacent portion of 140 of trace signal 121. Delay elements 134, 136, and 138 are also sized to provide a phase shift between the clock signals transmitted on signal traces 124, 126, and 128, respectively, and the clock signals transmitted on the adjacent portions of signal traces 123, 125, and 127.

The resultant phase shifts reduce EMI emissions caused by the clock signals propagating over signal traces 121–128. Because signal traces can act as antennas, positioning long signal trace runs together that carry signals having a common frequency component (such as, e.g., signals having the same frequency or having frequencies that are multiples of each other) can amplify the antennae effect in producing EMI emissions. Consequently, providing a phase shift between such signals propagating along adjacent signal traces reduces the total EMI emissions generated from the clock signals.

In one embodiment, each delay element 132, 134, 136, and 138 is sized to provide a 5 degree phase shift at the primary clock frequency between the clock signals propagating along signal traces 122, 124, 126, and 128, respectively, and the clock signals propagating along the portions of the signal traces (121, 123, 125, and 127) adjacent to those signal traces. However, the phase shift may range anywhere from greater than zero degrees up to 180 degrees with 180 degrees being preferable. However, the amount of delay provided by a delay element may be limited by other constraints such as available surface area and the tolerated signal attenuation that the delay adds.

With some systems having multiple parallel portions of signal traces carrying a common signal (e.g., signal traces 123–128), each delay element may be sized to provide a different phase shift such that each signal is offset from the signals propagating on the other traces with clock circuit side delay elements. In some embodiments, each signal trace would have a delay element at the clock circuit side of the adjacent portions such that all signals are phase shifted from the others.

Signal traces 121, 123, 125, and 127 each include delay elements 131, 133, 135, and 137, respectively, on the RAM circuit side of the adjacent portions of the signal traces. These delay elements are sized to so that the clock signals received by all of the RAM circuits 111–118 are in sync with each other. In some embodiments, some of the signal traces having delay elements located on the clock circuit side of the adjacent portions also have delay elements on the RAM circuit side so as to synchronize the clock signals with those received by the other RAM circuits.

It is also understood that although FIG. 1 shows that the signal paths for providing a clock signal to the RAM circuits 111–118 includes signal traces and delay elements, the signal paths for providing the clock signal may also include other conductive components such as embedded traces, vias, pads, and series resistors.

Not shown in FIG. 1 (or in FIGS. 2–4) are other conventional items found on circuit boards such as 1) other components located on the planar side 102 or top side such as, e.g. other integrated circuits (ICs), other surface mounted electronic components, surface pads, surface mounted connectors, and other electrical traces; 2) embedded structures e.g. plated vias, embedded conductive signal layers, and other embedded power planes; and 3) attachment or mounting mechanisms e.g. screw holes and shielding connectors. These conventional items are not shown in the Figures of this application in order to more clearly illustrate the inventive aspects of the circuit boards. However, it is understood that circuit boards according to the present invention may incorporate some or all of the items as well as other items conventionally found on circuit boards.

Figure 2:
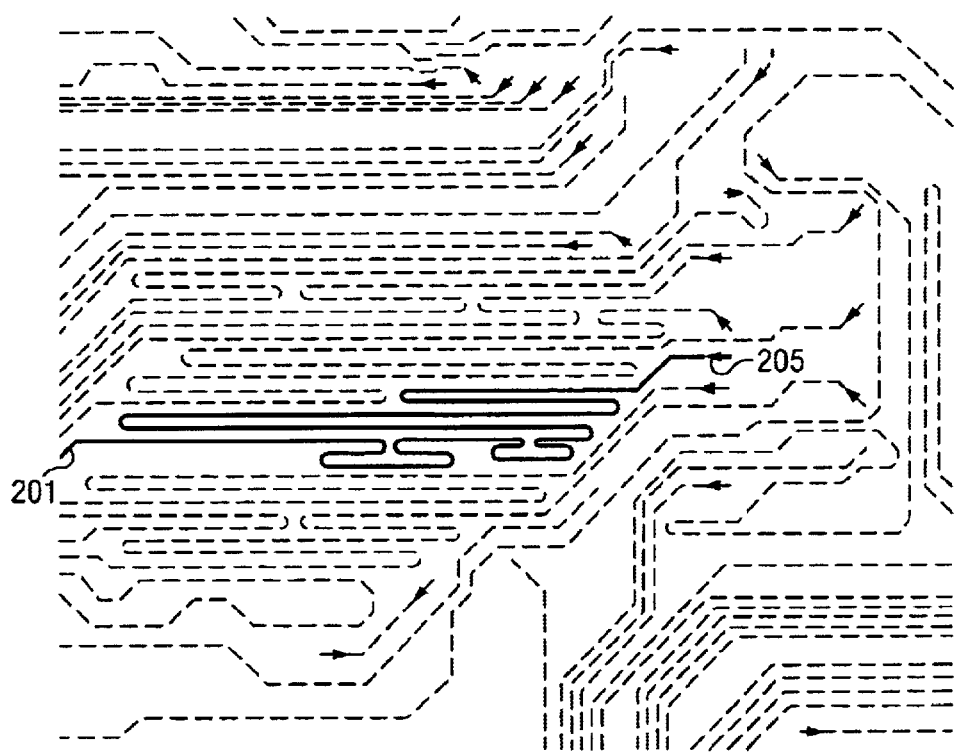
FIG. 2 is a partial view of an example of a signal trace layer according to the present invention.

FIG. 2 is a partial top view of a portion of a signal trace layer of a circuit board. Located on signal trace layer are several signal traces that are etched on the trace layer. Each signal trace shown in FIG. 2 is approximately 6 to 8 mils wide. However signal trace widths may vary with other circuits. The total area shown in FIG. 2 is roughly an inch by an inch and a half. Other signal trace layer structures maybe located the signal trace layer such as pads and reference planes (not shown).

$\epsilon r$

In FIG. 2, signal trace 201 is shown in bold. Signal trace 201 starts at via hole 205 and extends out past the left side of the portion of the signal trace layer shown in FIG. 2. Signal trace 201 includes a serpentine delay element to provide delay in a signal transmitted over signal trace 201. The amount of delay provided by a serpentine delay is dependent upon the actual length of the signal trace of the serpentine portion. The amount of delay per length is proportional to the dielectric constant ($\epsilon_r$) of the dielectric media of the circuit board. For surface routed signals (microstrip), the delay per inch is:

$$\text{Delay(ps/in)}=85[0.475\ \epsilon r+0.67]^{1/2}$$

For buried traces (stripline) the delay per inch is:

$$\text{Delay(ps/in)}=85[\epsilon r]^{1/2}$$

A dielectric constant for typical printed circuit boards is 4.5. In one example, approximately 5 to 6 inches of signal trace is need to provide 1 nano second of delay.

With other circuit boards, other types of delay elements may be used to provide a phase shift in signals transmitted along a signal trace. For example, discrete delay elements could also be used.

Figure 3:
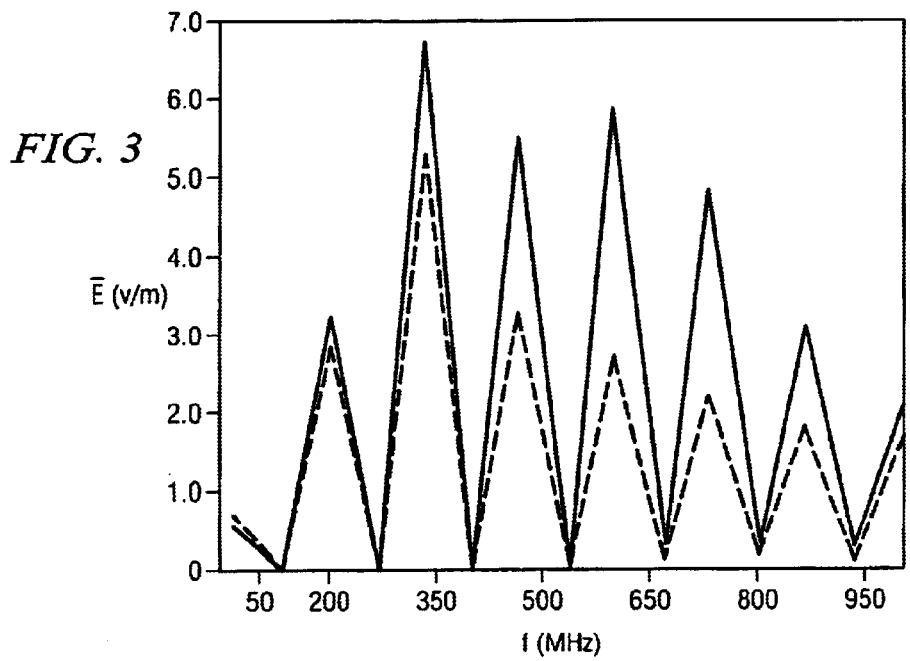
FIG. 3 is a graph of the results of a simulation showing a reduction in EMI emissions due to providing a phase shift between common signals transmitted on adjacent signal traces.

FIG. 3 shows a graph of simulation results comparing EMI emissions from common signals transmitted over two sets of signal traces having adjacent portions. This analysis was performed by transmitting over two sets of signal traces a simulated PCI computer bus 66 MHz clock signal with rise and fall times of 0.6/0.7 nano seconds. The clock signal had a voltage swing from 0 to 2.625 volts. The EMI emissions field strength was measured at 3 meters from the traces while the signals were being transmitted. The traces of each set are 5 mills wide and have a trace length of 2.2 inches with 800 mills length of adjacent trace located 20 mills from each other. The two circuits have a driver on resistance of 21.17 Ω and a driver pad capacitance of 5 pF. Also, each trace was routed 5 mils over a reference plane.

The solid line in FIG. 3 represents EMI emissions field strength measurements ($\overline{E}$) made over a range of frequencies from 30 MHz to 1000 MHz for the set of traces that did not include a delay element to provide a phase shift in the clock signals between the adjacent signal traces. The dashed line represents the same measurements made for the set of traces with a delay element providing 114 pico seconds of delay to provide a phase shift of 2.736 degrees at 66 MHz in the clock signals between adjacent traces. Although the delay of 114 pico seconds is small compared with the total period (15 nano seconds) of the clock signal cycle, the delay represents a significant portion (roughly 20%) of the output rise time (0.6 nanoseconds) of the clock signal.

As can be shown from the results, the field strengths measured from each set peak at the odd frequency harmonics (i.e. 198 MHz, 330 MHz, 462 MHz, etc.). The results clearly show that the set of signal traces with the phase shift produces less EMI emissions than the set without a phase shift. For the results shown in FIG. 2, the greatest difference in EMI emissions occurs at the 7th, 9th, and 11th harmonics. One possible explanation is that a delay element provides a greater phase shift at higher frequencies. For example, at 100 MHz, one nano second of delay provides a 36 degree phase shift. At 500 MHz, one nano second of delay provides a 180 degree phase shift. In some embodiments, the delay element would be sized to provide a phase shift that reduces the emissions of the harmonic component(s) producing the greatest emissions. With some systems, an 8 dB reduction in clock trace emissions can be obtained.

Figure 4:
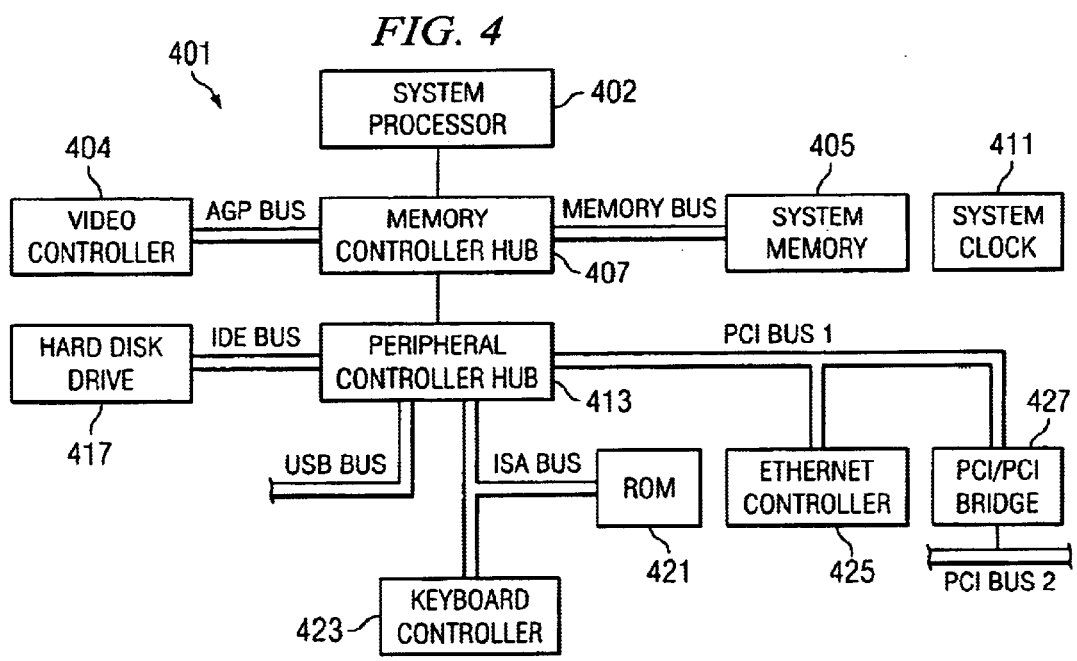
FIG. 4 is a block diagram of an example of a computer system according to the present invention.

FIG. 4 is a block diagram of a computer system. Computer system 401 includes a system memory 405 operably coupled to a system processor 402 (such as, e.g. an X86 compatible processor) via a memory bus and a memory controller hub 407. Computer system 401 also includes a video controller 409 operably coupled to a computer bus conforming to the Advanced Graphics Port (AGP) Standard. Computer system 401 also includes a number of other computer system busses operably coupled to system processor 402 via peripheral controller hub 413. A hard disk drive 417 is operably coupled to IDE computer bus, an Ethernet controller 425 is operably coupled to a PCI computer bus, and a ROM 421 and keyboard controller 423 are operably coupled to an ISA computer bus. Computer system 401 also includes a computer bus conforming to the Universal Serial Bus (USB) standard and a secondary PCI computer bus operably coupled to Peripheral Controller Hub 413 via a PCI/PCI bridge circuit 427. An example of a computer system is the OPTIPLEX GX1 computer system sold by the DELL COMPUTER CORP.

Computer system 401 also includes a system clock 411 that provides a clock signal to various circuits of computer system 401 such as RAM circuit chips (not shown) of system memory 405 (signal lines not shown in FIG. 4). For those clock signal traces that are adjacent to each other, either on the system board (not shown) or add-in card (not shown), delay elements can be added to the signal traces to provide a phase shift to reduce EMI emissions from those runs. Also, delay elements may be provided for other adjacent signal traces carrying signals having a common frequency component.

Those of skill in the art will recognize that, based upon the teachings herein, several modifications may be made to the embodiments shown in FIGS. 1–4. For example, delay elements may be added to embedded signal traces to provide a phase shift for signals having a common frequency component propagating over adjacent embedded portions. Also, the technique of providing a phase shift in signals having a common frequency component carried on adjacent signal traces may be used in both a system board and in add-in card circuit boards of a computer system.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit board comprising:
   a first signal trace for coupling to a first circuit to provide a first signal to the first circuit;
   a second signal trace for coupling to a second circuit to provide a second signal to the second circuit, the first signal and the second signal having a common frequency component;

wherein the first signal trace and the second signal trace each include adjacent portions being located adjacent to each other on a signal layer of the circuit board;

wherein the first signal trace includes a first delay element located generally towards a first side of its adjacent portion opposite a first circuit side of its adjacent portion to provide a phase shift between the first signal transmitted on the adjacent portion of the first signal trace and the second signal transmitted on the adjacent portion of the second signal trace to reduce electromagnetic interference emissions due to signals propagating on the adjacent portions of the signal traces.

2. The circuit board of claim 1 wherein the second signal trace includes a second delay element located generally towards a second circuit side of its adjacent portion opposite the first side of the adjacent portion of the first signal trace so as to provide the second signal to the second circuit generally in sync with the first signal being provided to the first circuit.

3. The circuit board of claim 2 wherein the first and second delay elements each include a serpentine trace.

4. The circuit board of claim 1 wherein the first circuit and the second circuit are mounted to the circuit board.

5. The circuit board of claim 1 wherein the signal layer is a surface trace layer.

6. The circuit board of claim 1 wherein the first signal and the second signal are clock signals.

7. The circuit board of claim 1 wherein the first and second signals have a rise time, wherein the first delay element provides a delay of at least 10% of the rise time.

8. The circuit board of claim 1 wherein the first delay element includes a serpentine trace.

9. The circuit board of claim 1 wherein the phase shift is at least one degree.

10. The circuit board of claim 1 wherein the first signal and the second signal have the same frequency.

11. A computer system comprising:
   a processor;
   a memory operably coupled to the processor; and
   a circuit board including:
      a first signal trace coupled to a first circuit to provide a first signal to the first circuit; and
      a second signal trace coupled a second circuit to provide the second signal to the second circuit, the first signal and the second signal having a common frequency component;
      wherein the first signal trace and the second signal trace each include adjacent portions being located adjacent to each other on a signal layer of the circuit board; wherein the first signal trace includes a first delay element located generally towards a first side of its adjacent portion opposite a first circuit side of its adjacent portion to provide a phase shift between the first signal transmitted on the adjacent portion of the first signal trace and the second signal transmitted on the adjacent portion of the second signal trace to reduce electromagnetic interference emissions due to signals propagating on the adjacent portions of the signal traces.

12. The computer system of claim 11 wherein the second signal trace includes a second delay element located generally towards a second circuit side of its adjacent portion opposite the first side of the adjacent portion of the first signal trace so as to provide the second signal to the second circuit generally in sync with the first signal being provided to the first circuit.

13. The computer system of claim 11 wherein the first circuit and the second circuit are mounted to the circuit board.

14. The computer system of claim 11 wherein the signal layer is a surface trace layer.

15. The computer system of claim 11 wherein the first signal and the second signal are clock signals.

16. The computer system of claim 15 wherein the first and second signals have a rise time, wherein the first delay element provides a delay of at least 10% of the rise time.

17. The computer system of claim 15 wherein the first circuit and the second circuit each include memory circuits of the memory.

18. The computer system of claim 17 wherein the first circuit and the second circuit each include RAM memory circuits.

19. The computer system of claim 11 wherein the first delay element includes a serpentine trace.

20. The computer system of claim 11 wherein the phase shift is at least one degree.

21. The computer system of claim 11 wherein the first signal and the second signal have the same frequency.

22. A circuit board comprising:
   a first signal trace for coupling to a first circuit to provide a first signal to the first circuit;
   a second signal trace for coupling to a second circuit to provide a second signal to the second circuit, the first signal and the second signal having a common frequency component;
   wherein the first signal trace and the second signal trace each include adjacent portions being located adjacent to each other on a signal layer of the circuit board; and
   means for providing a phase shift between the first signal transmitted on the adjacent portion of the first signal trace and the second signal transmitted on the adjacent portion of the second signal trace to reduce electromagnetic interference emissions due to the signals propagating on the adjacent portions of the signal traces.

23. The circuit board of claim 22 wherein the first signal and the second signal are clock signals.

24. A method for making a circuit board comprising:
   providing a first signal trace with an adjacent portion and a first delay located generally towards a first side of the adjacent portion, the first signal trace positioned to carry a first signal to a first circuit; and
   providing a second signal trace with an adjacent portion and a second delay located generally towards a second side of the adjacent portion, the adjacent portion of the second signal trace being adjacent to the adjacent portion of the first signal trace, the second signal trace is positioned to carry a second signal to a second circuit, the first signal and the second signal having a common frequency component;
   wherein the first and second delays are sized to provide a phase shift between the first signal transmitted on the adjacent portion of the first signal trace and the second signal transmitted on the adjacent portion of the second signal trace to reduce electromagnetic interference emissions due to the signals propagating on the adjacent portions of the signal traces and to provide the first signal to the first circuit generally in sync with the second signal being provided to the second circuit.

* * * * *